United States Patent [19]
Vogt et al.

[11] Patent Number: 5,491,755
[45] Date of Patent: Feb. 13, 1996

[54] CIRCUIT FOR DIGITAL PROCESSING OF AUDIO SIGNALS

[75] Inventors: Lothar Vogt, Hohenhameln; Matthias Herrmann, Hildesheim, both of Germany

[73] Assignee: Blaupunkt-Werke GmbH, Hildesheim, Germany

[21] Appl. No.: 183,029

[22] Filed: Jan. 18, 1994

[30] Foreign Application Priority Data

Feb. 5, 1993 [DE] Germany .......................... 43 03 386.5

[51] Int. Cl.$^6$ .................................................. H04B 1/00
[52] U.S. Cl. ................................................................ 381/86
[58] Field of Search ............................ 333/281; 381/101, 381/102, 86; 364/724.01, 724.16, 724.17, 724.19; 375/103, 14, 350, 345

[56] References Cited

U.S. PATENT DOCUMENTS

| | | | |
|---|---|---|---|
| 3,293,364 | 12/1966 | Richter | 179/1 |
| 5,127,058 | 6/1992 | Yamasaki | 381/102 |
| 5,157,623 | 10/1992 | Hayashi | 364/724.17 |
| 5,257,292 | 10/1993 | Sauvogerd et al. | 375/103 |
| 5,271,063 | 12/1993 | d'Arc | 381/86 |

FOREIGN PATENT DOCUMENTS

WO93/02503 2/1993 WIPO .............................. H04B 1/16

OTHER PUBLICATIONS

Patent Abstracts of Japan, vol. 13, No. 150 (E–742), Apr. 12, 1989 & JP-A-63 309 011 Matsushita Electric.
Patent Abstracts of Japan, vol. 12, No. 189 (E–616), Jun. 2, 1988 & JP-A-62 292 009 (Fujitsu Ten).
ICASSP 86 Proceedings. vol. 3 of 4 Apr. 1986, IEEE New York US, pp. 1537–1540, Application Specific Integrated Filters For HIFI Digital Audio Signal Processing By J. Van Ginderdeuren, et al.

*Primary Examiner*—Edward L. Coles, Sr.
*Assistant Examiner*—Jerome Grant, II
*Attorney, Agent, or Firm*—Frishauf, Holtz, Goodman, Langer & Chick

[57] ABSTRACT

In a circuit for digital processing of audio signals in a radio receiver, preferably in a car radio, the audio signals pass through a digital filter designed as a tone control, whose frequency response can be controlled with supplied coefficients, and a volume control, whose transmission factor can be controlled with supplied control signals. If the high and/or low frequencies are raised, the transmission factor of the filter at medium frequencies can be correspondingly lowered. Volume control compensates for the reduction. The volume control may contain a digital and an analog portion.

7 Claims, 11 Drawing Sheets

| $A_{VOL}$ | | | | | | | | Function |
|---|---|---|---|---|---|---|---|---|
| D7 | D6 | D5 | D4 | D3 | D2 | D1 | D0 | |
| 0 | 0 | 0 | 0 | 0 | 0 | 0 | 0 | 0 dB |
| 0 | 0 | 0 | 0 | 0 | 0 | 0 | 1 | -1 x 1.1875 dB |
| 0 | 0 | 0 | 0 | 0 | 0 | 1 | 0 | -2 x 1.1875 dB |
| ... | ... | ... | ... | ... | ... | ... | ... | ... |
| 0 | 1 | 0 | 0 | 0 | 0 | 0 | 1 | -65 x 1.1875 dB |
| x | x | x | x | x | x | x | x | x |

Fig. 7a

| Fader Front $A_{FF}$ | | | | Fader Rear $A_{FR}$ | | | | Function |
|---|---|---|---|---|---|---|---|---|
| D7 | D6 | D5 | D4 | D3 | D2 | D1 | D0 | |
| | | 0 | | 0 | 0 | 0 | 0 | 0 dB |
| | | | | 0 | 0 | 0 | 1 | -1 x 1.1875 dB |
| | | | | 0 | 0 | 1 | 0 | -2 x 1.1875 dB |
| | | | | ... | ... | ... | ... | ... |
| | | | | 1 | 1 | 1 | 1 | -15 x 1.1875 dB |
| 0 | 0 | 0 | 0 | | | | | 0 dB |
| 0 | 0 | 0 | 1 | | | 0 | | -1 x 1.1875 dB |
| 0 | 0 | 1 | 0 | | | | | -2 x 1.1875 dB |
| ... | ... | ... | ... | | | | | ... |
| 1 | 1 | 1 | 1 | | | | | -15 x 1.1875 dB |

Fig. 7b

| Fader Front $A_{FF}$ | | | | Fader Rear $A_{FR}$ | | | | Function |
|---|---|---|---|---|---|---|---|---|
| D7 | D6 | D5 | D4 | D3 | D2 | D1 | D0 | |
| | | | | 0 | 0 | 0 | 0 | 0 dB |
| | | | | 0 | 0 | 0 | 1 | -1 x 1.1875 dB |
| | | | | 0 | 0 | 1 | 0 | -2 x 1.1875 dB |
| | 0 | | | . | . | . | . | . |
| | | | | 1 | 1 | 1 | 1 | -15 x 1.1875 dB |
| 0 | 0 | 0 | 0 | | | | | 0 dB |
| 0 | 0 | 0 | 1 | | | | | -1 x 1.1875 dB |
| 0 | 0 | 1 | 0 | | | | | -2 x 1.1875 dB |
| . | . | . | . | | 0 | | | . |
| 1 | 1 | 1 | 1 | | | | | -15 x 1.1875 dB |

Fig. 7c

| $A_{KLH}/A_{KLT}$ | | | | $A_H/A_T$ | | | | H/T |
|---|---|---|---|---|---|---|---|---|
| D7 | D6 | D5 | D4 | D3 | D2 | D1 | D0 | |
| | | | | 0 | 0 | 0 | 0 | -14 dB |
| | | | | 0 | 0 | 0 | 1 | -12 dB |
| | | | | 0 | 0 | 1 | 0 | -10 dB |
| | | | | 0 | 0 | 1 | 1 | - 8 dB |
| | | | | 0 | 1 | 0 | 0 | - 6 dB |
| | | | | 0 | 1 | 0 | 1 | - 4 dB |
| | | | | 0 | 1 | 1 | 0 | - 2 dB |
| | | | | 0 | 1 | 1 | 1 | 0 dB |
| | | | | 1 | 0 | 0 | 0 | 2 dB |
| | | | | 1 | 0 | 0 | 1 | 4 dB |
| | | | | 1 | 0 | 1 | 0 | 6 dB |
| | | | | 1 | 0 | 1 | 1 | 8 dB |
| | | | | 1 | 1 | 0 | 0 | 10 dB |
| | | | | 1 | 1 | 0 | 1 | 12 dB |
| | | | | 1 | 1 | 1 | 0 | 14 dB |
| | | | | 1 | 1 | 1 | 1 | x |
| 0 | 0 | 0 | 0 | | | | | 0 dB |
| 0 | 0 | 0 | 1 | | | | | -1 x 1.1875 dB |
| 0 | 0 | 1 | 0 | | | | | -2 x 1.1875 dB |
| 0 | 0 | 1 | 1 | | | | | -3 x 1.1875 dB |
| 0 | 1 | 0 | 0 | | | | | -4 x 1.1875 dB |
| 0 | 1 | 0 | 1 | | | | | -5 x 1.1875 dB |
| 0 | 1 | 1 | 0 | | | | | -6 x 1.1875 dB |
| 0 | 1 | 1 | 1 | | | | | -7 x 1.1875 dB |
| 1 | 0 | 0 | 0 | | | | | -8 x 1.1875 dB |
| 1 | 0 | 0 | 1 | | | | | -9 x 1.1875 dB |
| 1 | 0 | 1 | 0 | | | | | -10 x 1.1875 dB |
| 1 | 0 | 1 | 1 | | | | | -11 x 1.1875 dB |
| 1 | 1 | 0 | 0 | | | | | -12 x 1.1875 dB |
| 1 | 1 | 0 | 1 | | | | | -13 x 1.1875 dB |
| 1 | 1 | 1 | 0 | | | | | -14 x 1.1875 dB |
| 1 | 1 | 1 | 1 | | | | | -15 x 1.1875 dB |

Fig. 8

| $AL_d$ ($A_{Rd}$) | $g_d$ |
|---|---|
| 0 | 1.0000000000 |
| 1 | 0.8721923828 |
| 2 | 0.7607421875 |
| 3 | 0.6635131836 |
| 4 | 0.5787353516 |
| 5 | 0.5047607422 |
| 6 | 0.4402465820 |
| 7 | 0.3840332031 |
| 8 | 0.3349609375 |
| 9 | 0.2921142578 |
| 10 | 0.2548217773 |
| 11 | 0.2222290039 |
| 12 | 0.1938476563 |
| 13 | 0.1690673828 |
| 14 | 0.1474609375 |
| 15 | 0.1286010742 |
| 16 | 0.1121826172 |
| 17 | 0.0978393555 |
| 18 | 0.0853271484 |
| 19 | 0.0744018555 |
| 20 | 0.0648803711 |
| 21 | 0.0565795898 |
| 22 | 0.0493774414 |
| 23 | 0.0430297852 |
| 24 | 0.0375366211 |
| 25 | 0.0327758789 |
| 26 | 0.0285644531 |
| 27 | 0.0249023438 |
| 28 | 0.0217285156 |
| 29 | 0.0189208984 |
| 30 | 0.0165405273 |
| 31 | 0.0144042969 |
| 32 | 0.0125732422 |
| 33 | 0.0109252930 |
| 34 | 0.0095214844 |
| 35 | 0.0083007813 |
| 36 | 0.0072631836 |
| 37 | 0.0063476563 |
| 38 | 0.0054931641 |
| 39 | 0.0048217773 |
| 40 | 0.0042114258 |
| 41 | 0.0036621094 |
| 42 | 0.0031738281 |
| 43 | 0.0027465820 |
| 44 | 0.0023803711 |
| 45 | 0.0020751953 |
| 46 | 0.0018310547 |
| 47 | 0.0015869141 |
| 48 | 0.0014038086 |
| 49 | 0.0012207031 |
| 50 | 0.0010375977 |
| 51 | 0.0009155273 |
| 52 | 0.0007934570 |
| 53 | 0.0006713867 |
| 54 | 0.0006103516 |
| 55 | 0.0004882813 |
| 56 | 0.0004272461 |
| 57 | 0.0003662109 |
| 58 | 0.0003051758 |
| 59 | 0.0003051758 |
| 60 | 0.0002441406 |
| 61 | 0.0001831055 |
| 62 | 0.0001831055 |
| 63 | 0.0001220703 |
| 64 | 0.0001220703 |
| 65 | 0.0001220703 |

Fig. 9

| $A_{LaF}$ ($A_{RaF}$) | $g_a$ | | $A_{LaR}$ ($A_{RaR}$) | $g_a$ | |
|---|---|---|---|---|---|
| 0 | 0.0000 | dB | 0 | 0.0000 | dB |
| 1 | -1.1875 | dB | 1 | -1.1875 | dB |
| 2 | -2.3750 | dB | 2 | -2.3750 | dB |
| 3 | -3.5625 | dB | 3 | -3.5625 | dB |
| 4 | -4.7500 | dB | 4 | -4.7500 | dB |
| 5 | -5.9375 | dB | 5 | -5.9375 | dB |
| 6 | -7.1250 | dB | 6 | -7.1250 | dB |
| 7 | -8.3125 | dB | 7 | -8.3125 | dB |
| 8 | -9.5000 | dB | 8 | -9.5000 | dB |
| 9 | -10.6875 | dB | 9 | -10.6875 | dB |
| 10 | -11.8750 | dB | 10 | -11.8750 | dB |
| 11 | -13.0625 | dB | 11 | -13.0625 | dB |
| 12 | -14.2500 | dB | 12 | -14.2500 | dB |
| 13 | -15.4375 | dB | 13 | -15.4375 | dB |
| 14 | -16.6250 | dB | 14 | -16.6250 | dB |
| 15 | -17.8125 | dB | 15 | -17.8125 | dB |
| 16 | -19.0000 | dB | 16 | -19.0000 | dB |
| 17 | -20.1875 | dB | 17 | -20.1875 | dB |
| 18 | -21.3750 | dB | 18 | -21.3750 | dB |
| 19 | -22.5625 | dB | 19 | -22.5625 | dB |
| 20 | -23.7500 | dB | 20 | -23.7500 | dB |
| 21 | -24.9375 | dB | 21 | -24.9375 | dB |
| 22 | -26.1250 | dB | 22 | -26.1250 | dB |
| 23 | -27.3125 | dB | 23 | -27.3125 | dB |
| 24 | -28.5000 | dB | 24 | -28.5000 | dB |
| 25 | -29.6875 | dB | 25 | -29.6875 | dB |
| 26 | -30.8750 | dB | 26 | -30.8750 | dB |
| 27 | -32.0625 | dB | 27 | -32.0625 | dB |
| 28 | -33.2500 | dB | 28 | -33.2500 | dB |
| 29 | -34.4375 | dB | 29 | -34.4375 | dB |
| 30 | -35.6250 | dB | 30 | -35.6250 | dB |
| 31 | -36.8125 | dB | 31 | -36.8125 | dB |
| 32 | -38.0000 | dB | 32 | -38.0000 | dB |

Fig. 10

CIRCUIT FOR DIGITAL PROCESSING OF AUDIO SIGNALS

FIELD OF THE INVENTION

The invention relates generally to a circuit for digital processing of audio signals and, more particularly, to a circuit for use in radio receivers for motor vehicles.

BACKGROUND

For radio receivers, circuits to process audio signals are generally known. These circuits enable tone control, particularly of the frequency response for high and low frequencies, volume control, and for stereo reproduction, balance adjustments. For reproduction with more than two loudspeakers, an adjustment of the volume relationship between the individual groups of speakers, such as between the front and back speakers in a car, is likewise known. There are various advantages to the use of digital circuits for such tasks, like good reproducibility of the settings, simple realizability with integrated circuits and the end to calibration due to variances in production.

In processing digital audio signals, the number of quantization stages is a significant factor. Often a 16 bit quantization of the audio signals at the analog/digital conversion is carried out. This is perceived adequate for obtaining reasonably low quantization noise, even st the high dynamics of musical performances. However, this is only true, if the amplitude range to be quantized is completely utilized.

THE INVENTION

It is the object of the invention to suggest a circuit for digital processing of audio signals, with the fullest possible utilization of the available amplitude range for the audio signals, in spite of various intrusions into the transmission characteristics.

The circuit according to the invention is particularly well suited to implementation using an integrated circuit that receives the audio signals in digital form, for instance in 16 bit width.

An advantageous embodiment of the invention is that for creating the coefficient of the digital filter additional control signals can be supplied controlling the frequency response profile for high and low frequencies in relation to medium frequencies. When raising the high and/or low frequencies, the transmission factor of the filter for medium frequencies is lowered correspondingly. Another advantage is that a control signal characterizing the reduction can be supplied to the volume control to compensate for the reduction.

With this embodiment, the amplitude range available for quantization is utilized such that no distortions are created through exceeding the amplitude range when raising the high or low frequencies, and this without the need to allow for a reserve when adjustments are made without raising the high or low frequencies.

Because of the simultaneous application of all above mentioned adjustments concerning the volume of the individual loudspeakers, significant level differences are encountered, which in the worst possible case leaves only a small portion of the amplitude range for the quantization of the audio signal. In another embodiment of the invention, in order to prevent the development of quantization noises even for large adjustment ranges, provisions are made for the volume control to include at least one control element for digital signals followed by a digital/analog converter, and at least one control element for analog audio signals, and that control signals are supplied to the control elements such that the control element for digital audio signals operates as close to the maximum transmission factor as possible.

An improvement of this invention is that the control elements exhibit an exponential characteristic between the transmission factor and the numeric value of the supplied control signal and that superimposition of the control signals is performed by addition. This significantly simplifies the circuits for superimposition of the individual control signals.

DRAWINGS

Further features of the preferred embodiments will be apparent from the drawings, of which:

FIG. 7 are tables of the control signals that can be supplied to the circuit for volume control according to the invention;

FIG. 8 are tables of the control signals that can be supplied to the circuit for tone control according to the invention;

FIG. 9 is a table concerning the assignment of a signal for volume control to a transmission factor for audio signals as part of the circuit, according to the invention; and FIG. 10 is a table concerning the assignment of another internal control signal to another transmission factor for the audio signals.

Figure 1:
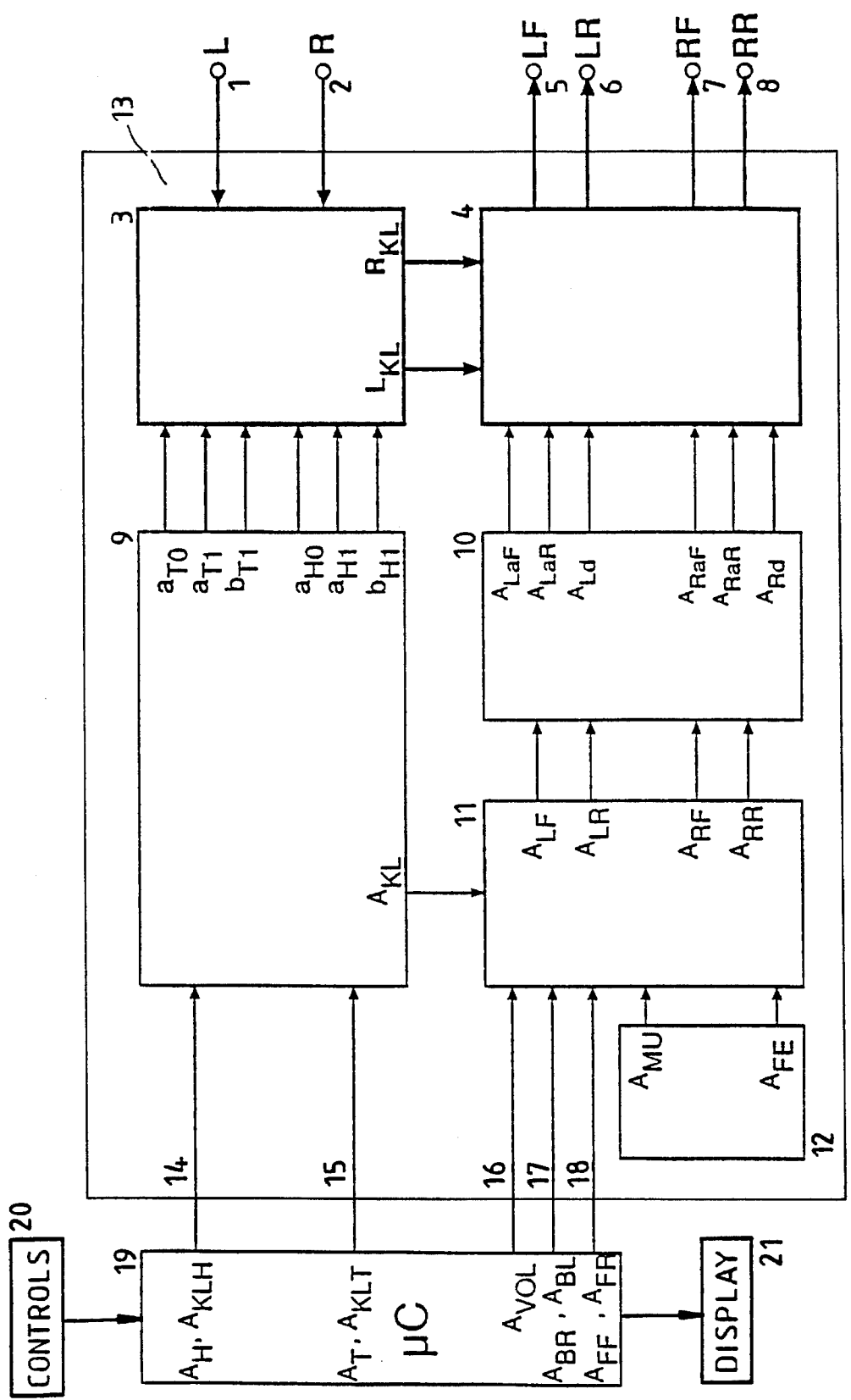
FIG. 1 is a block diagram of an embodiment of the invention.

The same components are labeled with the same reference characters in each drawing. The exemplary embodiment of the invention and parts thereof are shown as block diagrams. However, this does not imply that the circuit of the present invention is limited to being realized through individual blocks conforming to the corresponding circuits. Rather, the circuit can be implemented in a particularly advantageous manner using highly integrated circuits. It is possible to employ digital signal processors, which, if programed accordingly, can perform the processing steps depicted in the block diagrams. The circuit of the present invention can form significant portions of a radio receiver when combined with other circuits as part of an integrated circuit.

DETAILED DESCRIPTION

Digital audio signals L and R, coming preferably from a stereo decoder of a radio receiver, can be supplied to inputs 1 and 2 of the circuit according to FIG. 1. Via a digital tone control 3, the audio signals are supplied as signals $L_{KL}$ and $R_{KL}$ to a volume control 4 with four outputs 5, 6, 7, 8, of which each can supply a corresponding signal LF, LR, RF, and RR. With suitable output amplifiers, these signals can each be supplied to a loudspeaker. Two loudspeakers each are intended for the left and the right channel. In a car for instance, they may be placed in the front and the rear.

Tone control 3 and volume control 4 together with circuits 9, 10, 11, and 12, serving the derivation calculation or generation of various coefficients and control signals, form a circuit 13, hereafter called audio processor. On other inputs 14, 15, 16, 17, and 18, various control signals are supplied to the audio processor by a microcomputer 19. This microcomputer 19 can be designed as a so-called device microcomputer, which means it can control additional functions, like station tuning, within a device such as a radio receiver. Any of several standard microprocessors, such as those made by Motorola, can be used. Control elements 20 and display devices 21 are connected to the microcomputer 19.

From the microcomputer, the audio processor 13 receives the signals listed in detail in the following table:

| Input | Symbol | Description |
|---|---|---|
| 14 | $A_H$ | Treble cut or boost |
|  | $A_{KLH}$ | Treble control evaluation factor |
| 15 | $A_T$ | Bass cut or boost |
|  | $A_{KLT}$ | Bass control evaluation factor |
| 16 | $A_{VOL}$ | Volume control |
| 17 | $A_{BR}$ | Balance adjustment, right |
|  | $A_{BL}$ | Balance adjustment, left |
| 18 | $A_{FF}$ | Fading, front |
|  | $A_{FR}$ | Fading, rear |

The correlation between the control signals at inputs 14 and 15 with the corresponding effects on the audio signals is shown in table format in FIG. 8. Binary digits D0 to D3 serve as control signals $A_T$ and $A_H$ for boosting or cutting bass T or treble H between −14 and +14 dB. Binary digits D4 to D7 form the control signals $A_{KLT}$ and $A_{KLH}$ each causing a cut of 1.1875 dB per increment of the transmission factor of tone control 3 for medium frequencies.

Figure 2:
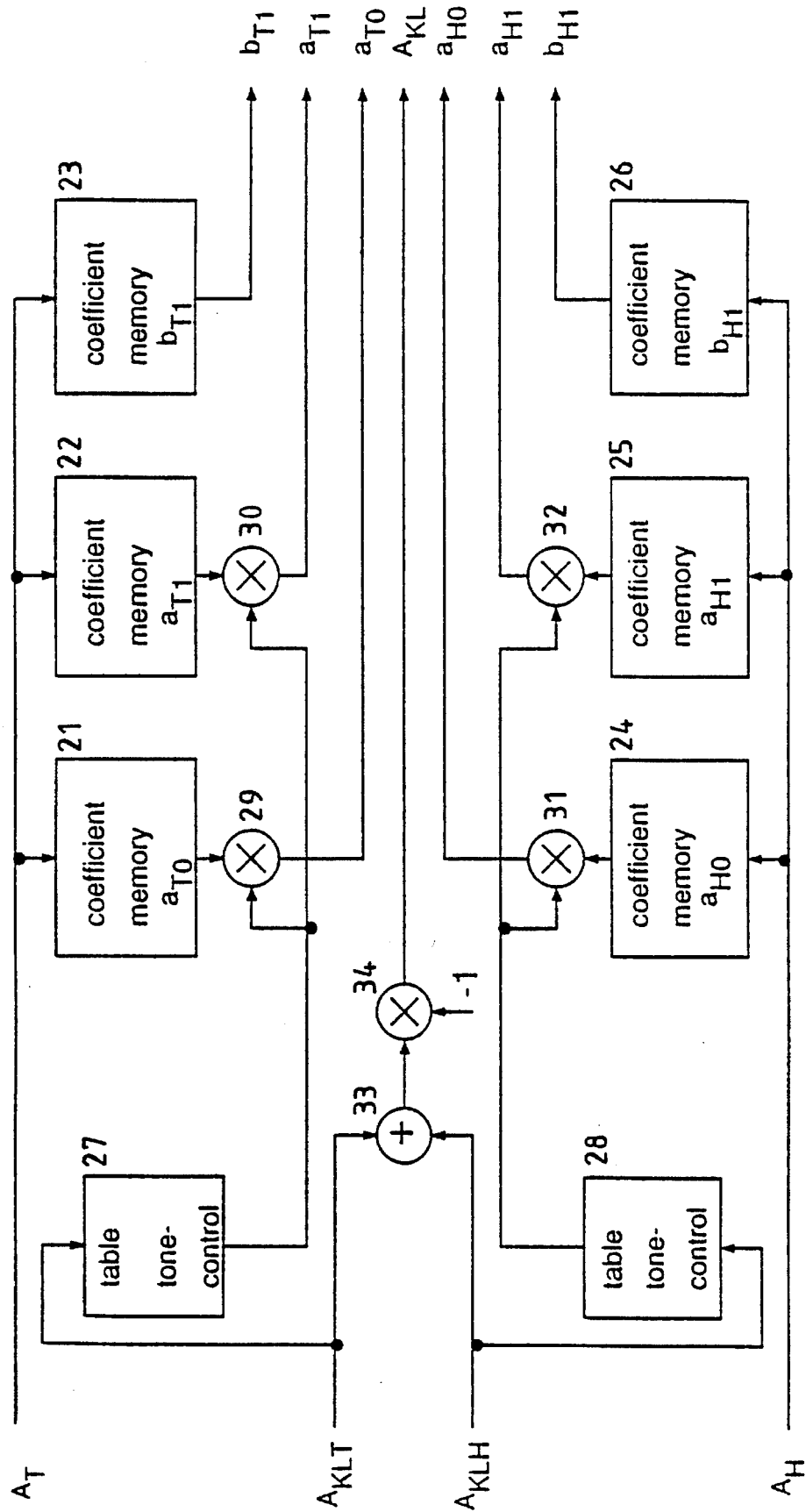
FIG. 2 is a block diagram of a device for calculating filter coefficients in a circuit according to FIG. 1.

From the control signals concerning tone control, supplied to inputs 14 and 15, the coefficients for tone control are determined in the circuit 9 depicted in FIG. 2. Control signals $A_T$ and $A_H$ contain addresses at which the respective coefficients are stored in memory. Memories 21, 22, and 23 for coefficients $a_{T0}$, $a_{T1}$, and $b_{T1}$ are used for bass control and memories 24, 25, and 26 for coefficients $a_{H0}$, $a_{H1}$, and $b_{H1}$ are used for treble control.

In addition to the addresses, which are formed by four binary digits of a data word each, supplied via inputs 14 and 15 (FIG. 1), the binary digits D4 to D5 represent control signals $A_{KLH}$ and $A_{KLT}$ respectively, which cause a level decrease of the audio signals to prevent overmodulation of the value range of the digital audio signals when boosting treble and bass. This practically normalizes the transmission factor for the raised frequency ranges. Signals $A_{KLH}$ and $A_{KLT}$ respectively are supplied as address to additional memory each, which in turn creates a factor each for the coefficients $a_{T0}$, $a_{T1}$, $a_{H0}$, and $a_{H1}$, and by which the coefficients are multiplied at 29, 30, 31, and 32. Parameters $A_{KLH}$ and $A_{KLT}$ are added at 33 and multiplied by 34. The result later serves to compensate for signal fading caused by normalization.

From the circuit depicted in FIG. 2, the coefficients are supplied to tone control 3, while signal $A_{KL}$ is supplied to circuit 11 (FIG. 1).

Figure 3:
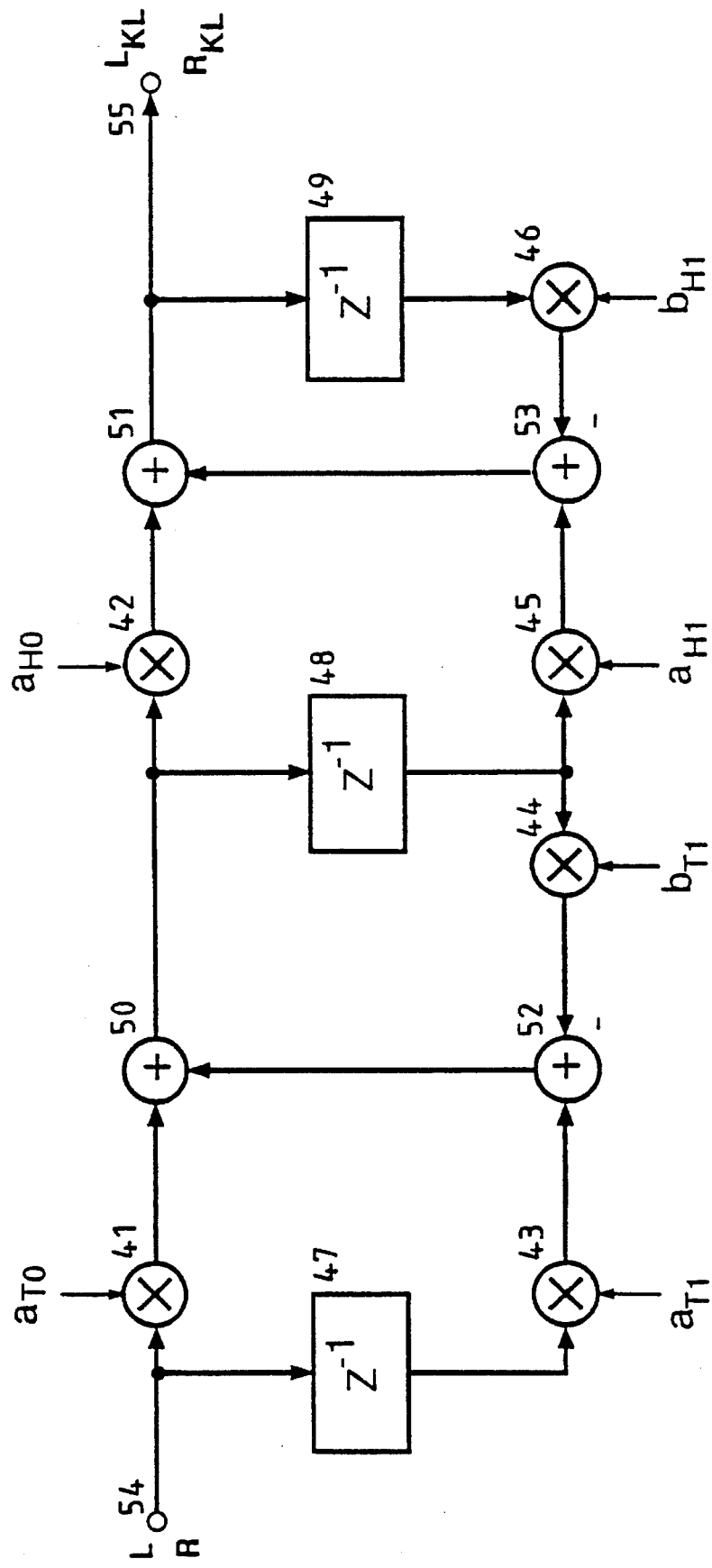
FIG. 3 is a controllable filter used as tone control.

Tone control 3 is explained in greater detail below with the aid of FIG. 3. Only one of two tone controls intended for each channel is depicted as block diagram. This tone control exhibits a recursive structure with six multipliers 41, 42, 43, 44, 45, and 46, three delay elements 47, 48, and 49, and four adders 50, 51, 52, and 53. Treble and bass control are performed separately through simultaneous change of the respective filter coefficients $a_{T0}$, $a_{T1}$, and $b_{T1}$ for bass and $a_{H0}$, $a_{H1}$, and $b_{H1}$ for treble. The respective audio signals L and R can be supplied to an input 54, output signals $L_{KL}$ and $R_{KL}$ are supplied to the volume control 4 (FIG. 1) from output 55.

Control signals $A_{VOL}$ for volume, $A_{BR}$ and $A_{BL}$ for balance, and $A_{FF}$ and $A_{FR}$ for the fader, that is for the volume ratio between the front and rear loudspeakers, describe the attenuation compared to the maximum transmission factor of volume control 4.

A zero value for these signals therefore describes a maximum transmission factor. In table format, FIG. 7a shows the relationship of individual values of the control signal $A_{VOL}$ and the corresponding attenuation. With each increment of $A_{VOL}$, the attenuation is increased by 1.1875 dB. The largest value that $A_{VOL}$ can assume is 65.

The relationship between control signals $A_{BL}$ and $A_{BR}$ on one hand and attenuation on the other is specified in similar fashion for the exemplary embodiment. This relationship is depicted in FIG. 7b. Since a smaller control range is sufficient for balance adjustment, both control signals are put out together with one byte. In similar fashion, each data word put out by the microcomputer 19 (FIG. 1) contains the control signals $A_{FF}$ and $A_{FR}$. Their relationship to the attenuation values is shown in FIG. 7c.

In circuit 11, the control signals described are combined to four control signals $A_{LF}$, $A_{LR}$, $A_{RF}$, and $A_{RR}$, each describing the attenuation of one of the outputs 5 through 8. Two additional control signals are taken into consideration. They are $A_{MU}$ and $A_{FE}$, which are created in circuit 12 for evaluation of the signal quality. Control signal $A_{MU}$ is an additional attenuation of 3 dB when the reception is distorted, while $A_{FE}$ results in a significantly larger attenuation when the reception is distorted (noise attenuation), namely 30 dB.

Figure 4:
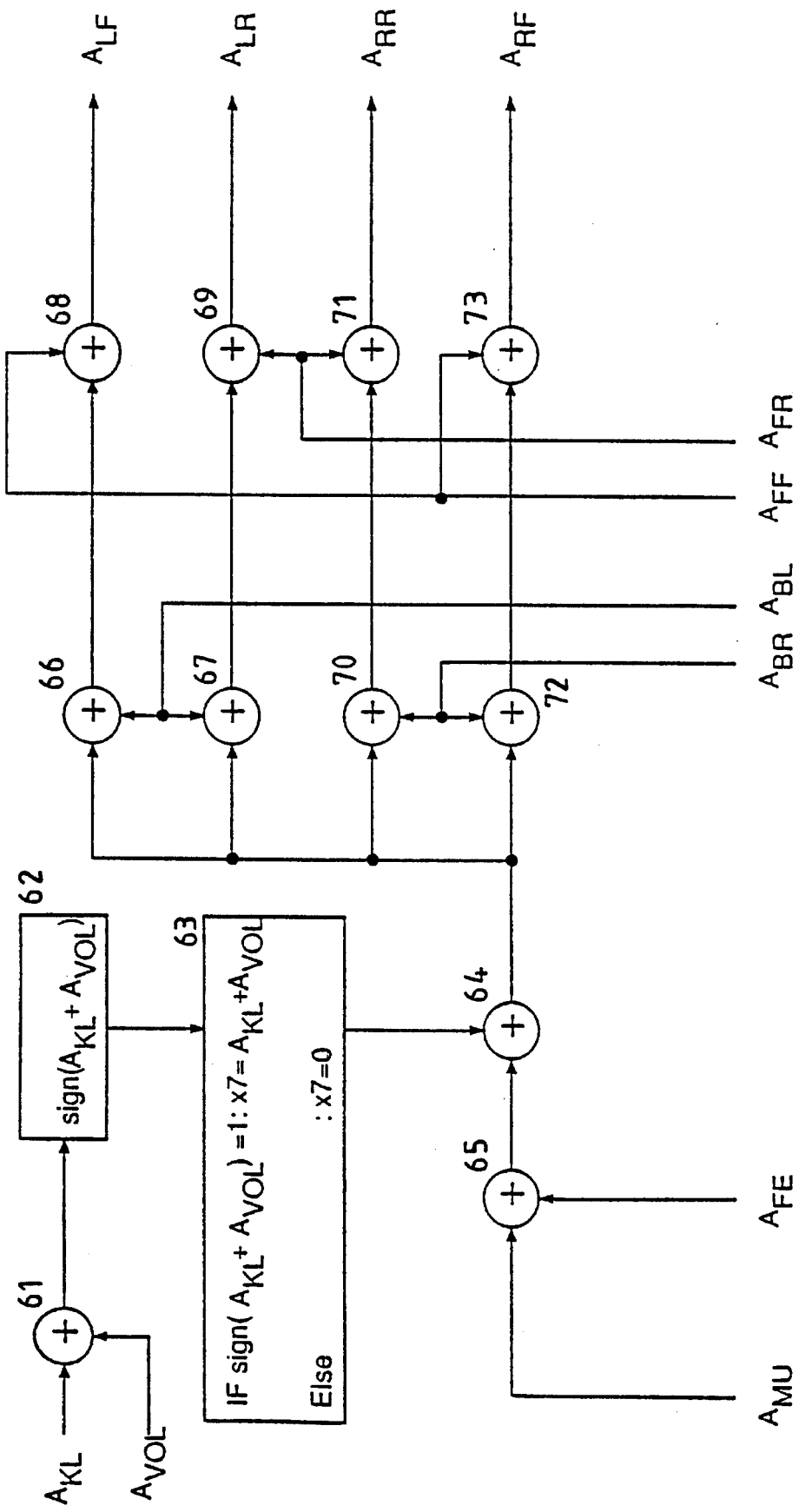
FIG. 4 is a block diagram of a circuit to process control signals for volume control.

FIG. 4 shows in block diagram format how the control signals are combined in circuit 11. Adding parameter $A_{KL}$ to the control signal $A_{VOL}$ compensates signal fading caused by normalization in connection with the tone control. However, it needs to be ensured that the sum to be processed further is not less than zero. For this purpose, the sign of the sum of $A_{KL}$ and $A_{VOL}$ is determined in 62, and at 63 either the sum, if the sign is positive; otherwise a Zero value is supplied to an adder 64.

In addition, the attenuation values $A_{MU}$ and $A_{FE}$ are supplied to the adder 64 via another adder 65. Following the adder 64, the signal is split into the four channels to build the attenuation values for the four output audio channels. Two of the adder circuits 66 to 73 are assigned to each channel. Of the control signals for balance, $A_{BR}$ is supplied to adder circuits 70, 72, and $A_{BL}$ to adder circuits 66, 67 to influence the two left and the two right channels. Control signals $A_{FF}$ and $A_{FR}$ are supplied to adder circuits 68, 73 and 69, 71 respectively. One control signal can thus influence either both of the front channels or both of the rear channels.

The output signals of circuit 11 (FIG. 1, FIG. 4) are supplied to the splitter circuit 10 which forms the control signals for several control elements that are each located in a channel of the volume control, thus "splitting" the control signals. As has been mentioned in the beginning, a main advantage of the invention is utmost optimal utilization of the available quantization stages, preferably a 16-bit quantization. That means, as many quantization stages as possible should remain for the output signal at each moment, even if the supplied control signals result in high signal attenuation. Thus, in the volume control one attenuation control element each is provided for both the digital stage and the analog stage.

As will be described in greater detail in connection with FIG. 6, one digital control element each is assigned to the left and to the right channels, while one control element for analog signals each is intended for the left front, the right front, the left rear, and the right rear channels. Thus, in the splitter circuit 10, two signals $A_{Ld}$ and $A_{Rd}$ to control the digital attenuation control elements, and four signals $A_{LaF}$, $A_{LaR}$, $A_{RaR}$, and $A_{RaF}$ for controlling the analog attenuation control elements, are derived from the four supplied signals.

The resulting attenuations are divided among the above mentioned output signals of circuit 10 in such a way that the analog control elements cause a maximum attenuation, and that for resulting attenuations that are higher than the maximum attenuation of the analog control elements, an additional attenuation is achieved with the digital control elements. This obtains the best possible modulation for the digital/analog converters.

Figure 5:
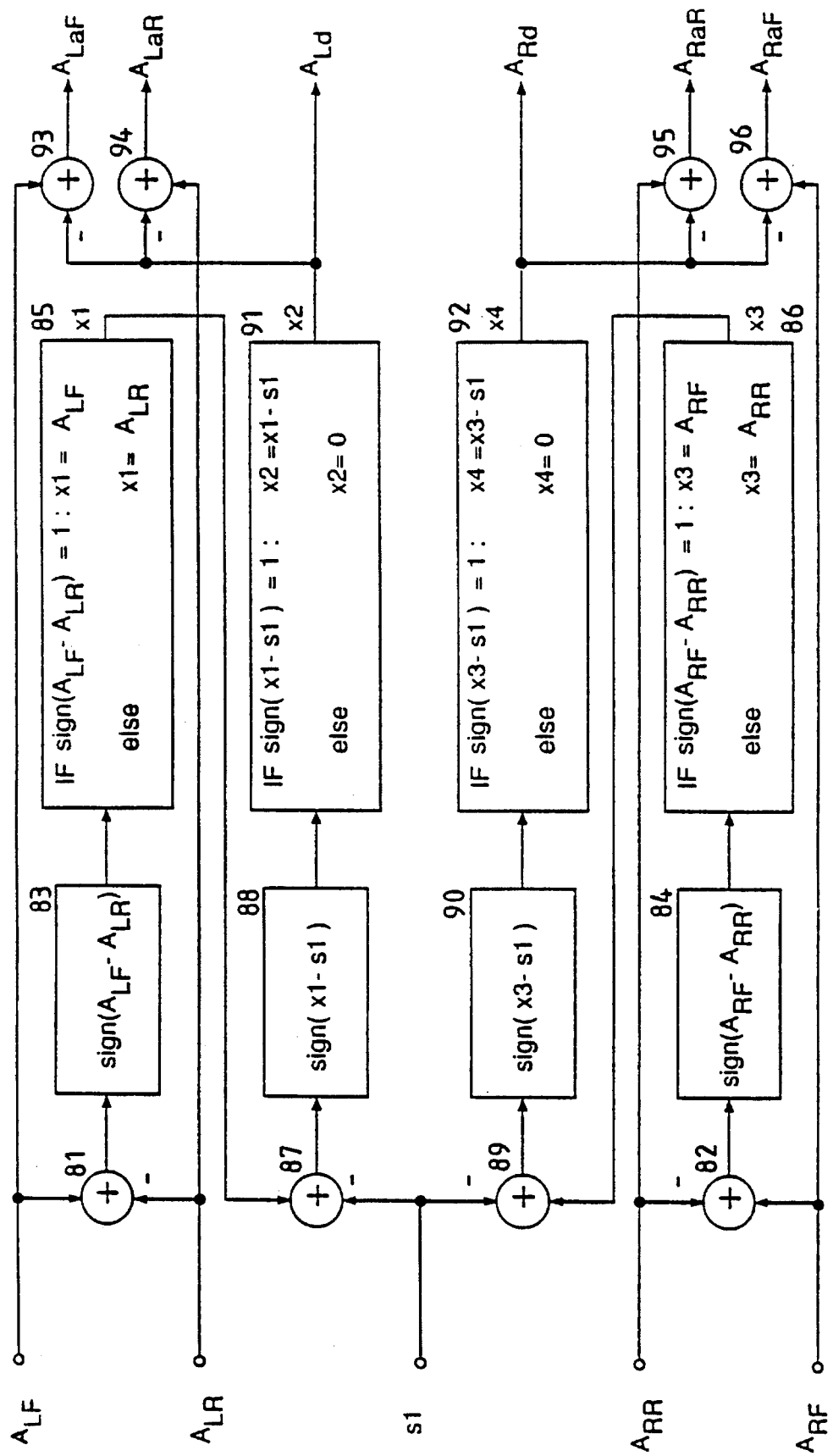
FIG. 5 is another circuit for processing the control signals processed with a circuit according to FIG. 4.

For both the left and the right channel (FIG. 5) the difference is being obtained in 81 and 82 respectively, followed by sign determination 83, 84. With 85, 86 the respective larger attenuation value is passed on as value x1 or x3 respectively and compared to a threshold s1 at 87, 88 or 89, 90 respectively. Threshold s1 represents the maximum attenuation of the analog fader. The difference x1–s1 or x3–s1 respectively is therefore the attenuation value remaining for the digital control element. The subsequent logic evaluation 91, 92 of this difference ensures that the value for x2=$A_{Ld}$ or x4=$A_{Rd}$ is not less than zero. The attenuation values for the analog control elements are formed with the aid of subtractors 93 to 96.

Figure 6:
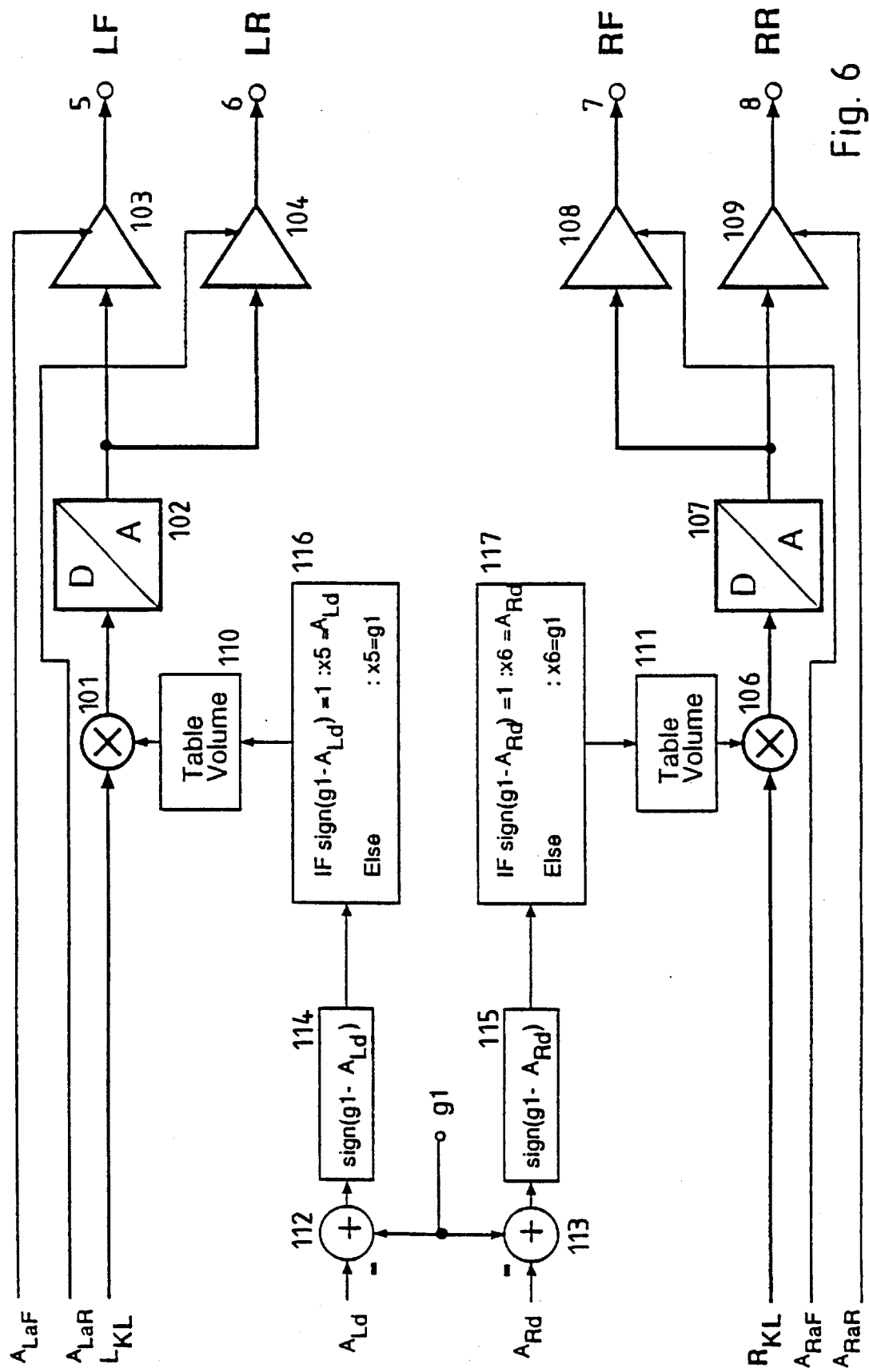
FIG. 6 is a block diagram of a volume control.

FIG. 6 depicts an embodiment of the volume control 4 (FIG. 1), again in block diagram format. The left channel for the signal $L_{KL}$ contains a multiplier 101 as digital control element, a digital/analog converter 102, and, in the analog section, is split into a front and a rear channel, each containing an analog attenuation control element 103, 104, in the analog section. Signals LF and LR can be received at outputs 5,6. The right channel is designed in the same fashion and contains a multiplier 106, a digital/analog converter 107 and analog attenuation control elements 108, 109.

The attenuation control elements are made of generally well-known networks, whose attenuation is controllable with digital signals. For this purpose, the control signals $A_{LaF}$, $A_{LaR}$, $A_{RaF}$, and $A_{RaR}$ are supplied to the analog attenuation control elements 104, 103, 108, 109. The dependence of the transmission factor $g_a$ on the control signals is shown in FIG. 10.

Control signals $A_{Ld}$ and $A_{Rd}$ each are supplied as addresses to a memory 110, 111, which contains factors for multipliers 101,106, and therefore the transmission factor $g_d$. One example of the contents of these tables is shown in FIG. 9, where the values for control signals $A_{Ld}$ and $A_{Rd}$ respectively are shown as decimal numbers. The broken horizontal line between values 15 and 16 indicates how much the level for medium frequencies can be lowered because of a corresponding bass and treble boost and still be compensated for by the control elements.

Control signals $A_{Ld}$ and $A_{Rd}$ are monitored logically to prevent exceeding of the address range of memories 110, 111. For this purpose, they are each compared to a preset value g1 with the aid of subtractor 112, 113 and sign recognition 114, 115. As long as the respective control signal is smaller than g1, the control signal is passed on by a respective logic circuit 116, 117. But if $A_{Ld}$ or $A_{Rd}$ respectively is greater than g1, the maximum value g1 is used as address for the respective memory 110, 111.

Various changes and modifications are possible within the scope of the inventive concept.

What is claimed is:

1. A circuit for digital processing of audio signals in a vehicle radio receiver, comprising:

a digital filter serving as a tone control of the radio receiver, said digital filter having a frequency response which is controllable responsive to supplied coefficients; and a volume control for controlling a volume of the radio receiver responsive to control signals;

said digital filter having controllable low frequency, high frequency and medium frequency transfer profiles, said transfer profiles being controlled responsive to respective control signals such that when at least one of said high and low frequency transfer profiles of said digital filter is increased relative to said medium frequency transfer profile, said medium frequency transfer profile of said digital filter is decreased; and a control signal corresponding to the decrease of the medium frequency transfer profile of said digital filter being supplied to said volume control to cause said volume control to compensate a volume of the vehicle radio receiver based on the decrease of the medium frequency profile of the digital filter;

whereby the decrease in the medium control frequency transfer profile of said digital filter normalizes a transmission factor for the at least one of the high and low frequency transfer profiles that was increased.

2. A circuit for digital processing of audio signals in a vehicle radio receiver, comprising:

a digital filter connected to receive the audio signals, said digital filter serving as a tone control of the radio receiver, said digital filter having a frequency response which is controllable with supplied coefficients; and a volume control having a transmission factor that is controllable with supplied control signals;

the volume control comprising:

at least a first control element (101, 106) for controlling digital signals from the digital filter, said at least a first control element being connected to a digital/analog converter (102, 107), and at least one second control element (103, 104, 108, 109) for controlling the audio signals as the audio signals are processed by said circuit; and at least one of the supplied control signals being provided to the first and second control elements (101, 106, 103, 104, 108, 109) such that at least a first control element 101, 106) is operated with a maximum transmission factor; and wherein the digital filter has controllable low frequency, high frequency and medium frequency transfer profiles, said transfer profiles being controlled responsive to respective supplied control signals such that when at least one of said high and low frequency transfer profiles is increased relative to the medium frequency transfer profile of said digital filter, said medium frequency transfer profile is decreased.

3. The circuit according to claim 2, wherein:

the supplied control signals create the supplied coefficients, said supplied control signals being formed from addresses stored in a memory of said digital filter; and at least a portion of coefficient data stored in said memory is read from said memory and is multiplied by a volume control signal, said volume control signal being dependent on at least one of the supplied control signals that controls the decrease in the medium frequency transfer profile.

4. The circuit according to claim 3, wherein:

when the high frequency transfer profile of the digital filter is increased and when the low frequency transfer profile of the digital filter is also increased, then control signal generating means generates first and second control signals such that a sum of the first and second control signals form one of the supplied control signals which provides a compensating decrease in the medium frequency transfer profile of the digital filter.

5. The circuit according to claim 3, wherein:

the supplied control signals include at least a volume control signal and a balance control signal of the vehicle radio receiver, said supplied control signals being supplied to a means for processing stereo signals;

the supplied control signals and another control signal compensate for the medium frequency transfer profile decrease in the tone control provided by said digital filter and the supplied control signals and said another control signal are superposed to form a plurality of further control signals for controlling respective left and right channels of the vehicle radio receiver; and a splitter is provided for splitting the plurality of further control signals for the left and right channels into still further control signals for the first control elements (101, 106) for digital audio signals and for the at least one second control elements (103, 104, 108, 109) for the analog audio signals.

6. The circuit according to claim 5, wherein:

two additional control elements (103, 104, 108, 109) are arranged in parallel for the left and the right channels;

and a relationship between a transmission factor of said two additional control elements is controlled by one of the supplied control signals that is superposed over the volume and the balance control signals.

7. The circuit according to claim 2, wherein:

the first and second control elements have an exponential characteristic between a transmission factor thereof and a numeric value of the supplied control signals, applied to said digital filter; and an adder is provided for adding at least two of the supplied control signals to each other by an addition process.

* * * * *